United States Patent [19]

Takeda

[11] Patent Number: 4,532,419
[45] Date of Patent: Jul. 30, 1985

[54] MEMORY CARD HAVING STATIC ELECTRICITY PROTECTION

[75] Inventor: Masahiro Takeda, Ohmiya, Japan

[73] Assignee: Sony Corporation, Tokyo, Japan

[21] Appl. No.: 528,467

[22] Filed: Sep. 1, 1983

[30] Foreign Application Priority Data

Sep. 9, 1982 [JP] Japan .............................. 57-156982
Sep. 30, 1982 [JP] Japan ........................... 57-148913[U]

[51] Int. Cl.³ .................................................. G06K 19/06
[52] U.S. Cl. ................................... 235/492; 361/212
[58] Field of Search ............... 235/492; 361/212, 128, 361/129, 397; 365/244; 357/47, 50

[56] References Cited

U.S. PATENT DOCUMENTS 3,702,464 11/1972 Castrucci ............................ 235/492
4,322,777 3/1982 Ueta et al. ...................... 361/212 X Primary Examiner—David L. Trafton
Attorney, Agent, or Firm—Lewis H. Eslinger, Alvin Sinderbrand

[57] ABSTRACT

A memory card includes a card support formed by two plastic boards; a printed circuit board mounted on the card support; an integrated circuit mounted on the printed circuit board and including a memory for storing information, a central processing unit for accessing the information, and access terminals connected to the memory and central processing unit for accessing the information from the memory; a plurality of connection terminals provided on an exposed surface of the printed circuit board; a common ground discharge pattern provided on the exposed surface of the printed circuit board and separated from the connection terminals by first discharge gaps; a plurality of lead terminals provided on a non-exposed surface of the printed circuit board and connected between respective ones of the connection terminals and respective ones of the access terminals of the integrated circuit; a second discharge pattern formed on the non-exposed surface and separated from the lead terminals by second discharge gaps such that undesirable static electricity supplied to the connection terminals on the exposed surface is discharged to the respective discharge patterns through the first and second discharge gaps.

13 Claims, 9 Drawing Figures

MEMORY CARD HAVING STATIC ELECTRICITY PROTECTION

BACKGROUND OF THE INVENTION

This invention relates generally to memory cards and, more particularly, is directed to a memory card for use as a credit card and/or identification card having an integrated circuit incorporated therein.

A memory card for use as a credit card and/or identification (ID) card has been proposed having a CMOS integrated circuit (IC) incorporated therein. The IC may include a central processing unit (CPU), a read only memory (ROM) for storing a program and personal data, and a random access memory (RAM) for providing a memory work area. The terminals of the IC are respectively connected to connection terminals formed on an exposed surface of the card. In this regard, during operation, the memory card is inserted into a card reader such that respective contacts of the card reader contact the aforementioned connection terminals to supply a drive voltage and control signals to the IC so that appropriate data stored therein is read out and supplied to the card reader.

However, as previously discussed, the aforementioned connection terminals of the memory card are exposed on the surface thereof, whereby static electricity generated from a human body or clothes, particularly clothes made from chemical fibers and the like, flow through the connection terminals to the IC to damage or destroy the latter. It is to be noted that, while the CMOS IC can withstand approximately 200 volts, static electricity may sometimes reach several thousand volts. Accordingly, known memory cards can not be carried in pockets of clothes made of chemical fibers or the like.

In order to avoid such damage to the IC, resistors having large resistance values, for example, 20KΩ to 30KΩ or more, are generally connected in series between various connection terminals and the IC to prevent the IC from being destroyed by static electricity. However, with respect to the power source connection terminal connected to the IC, a resistor having a resistance value of several ten KΩ cannot be connected in series therewith since a drive current of approximately 1 mA flows therethrough during energization of the IC. Accordingly, if no resistor or a resistor having a small resistance value is connected in series between the power source connection terminal and the IC, the IC is still damaged or destroyed by static electricity through the power source terminal. In addition, for the other connection terminals, it is to be noted that, although the resistors connected in series therewith having large resistance values can protect the IC against static electricity, if the resistance values of these resistors are increased too much, the time constant determined by such resistor and the input capacitance of the IC tend to cause the waveforms of the respective signals to be blunted and to be delayed.

OBJECTS AND SUMMARY OF THE INVENTION

Accordingly, it is an object of this invention to provide a memory card that avoids the above-described difficulties encountered with the aforementioned known arrangement.

More particularly, it is another object of this invention to provide a memory card having an integrated circuit incorporated therein which cannot be destroyed by static electricity.

It is another object of this invention to provide a memory card including means for discharging static electricity from the connection terminals thereof to prevent damage to the integrated circuit incorporated therein.

It is still another object of this invention to provide a memory card suitable for use as a credit card and identification card.

In accordance with an aspect of this invention, a memory card includes card support means; integrated circuit means mounted on said card support means for storing information and including access terminal means; connection terminal means provided on an exposed surface of said card support means and connected to said access terminal means of said integrated circuit means; and discharge means for discharging static electricity from said connection terminal means to prevent damage to said integrated circuit means.

The above, and other, objects, features and advantages of the present invention will become readily apparent from the following detailed description thereof which is to be read in connection with the accompaning drawings.

DETAILED DESCRIPTION OF THE PREFERRED EMBODIMENTS

Figure 1:
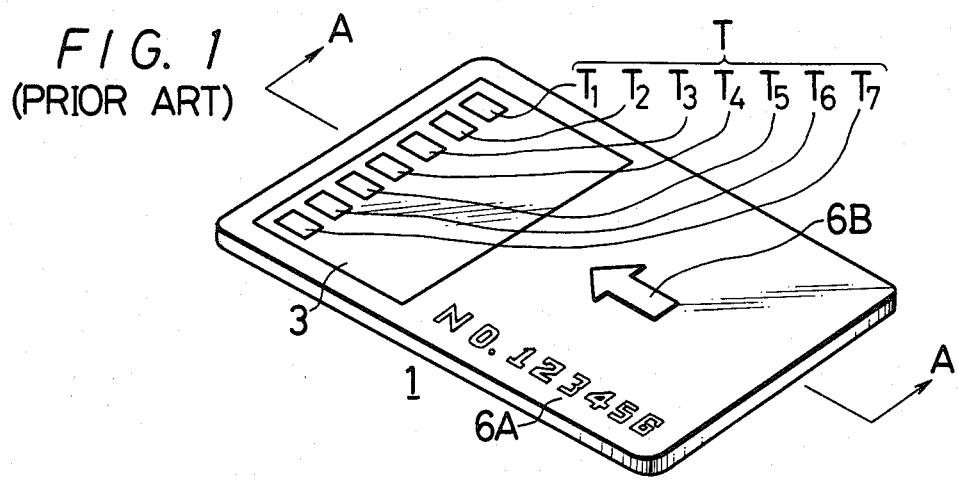
FIG. 1 is a schematic perspective view of a known memory card.
Figure 2:
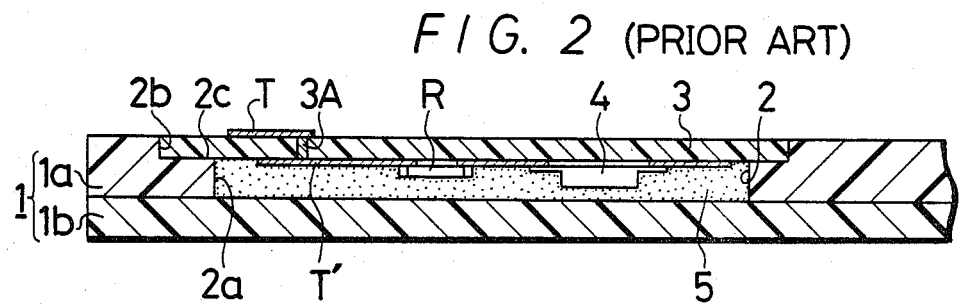
FIG. 2 is an enlarged cross-sectional diagram of the memory card of FIG. 1 taken along line A—A thereof.
Figure 3:
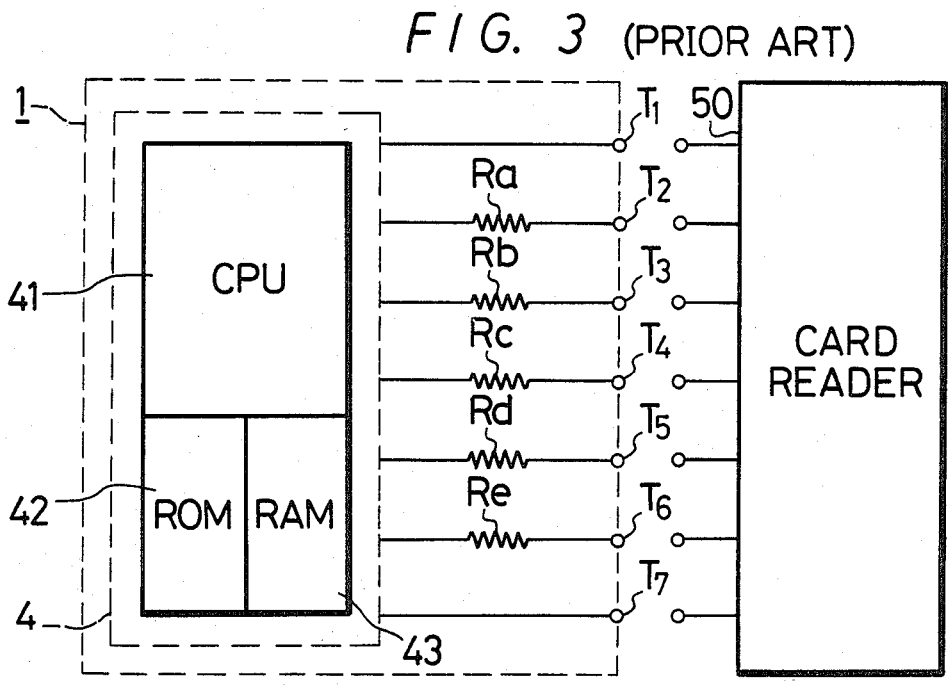
FIG. 3 is a schematic block diagram used for explaining the operation of the memory card of FIG. 1 with a card reader.

Referring to the drawings in detail, and initially to FIGS. 1-3 thereof, a known memory card 1 having a semiconductor integrated circuit (IC), formed preferably as a complementary metal oxide semiconductor (CMOS), incorporated therein, includes a card support of a substantially rectangular configuration and of a size convenient for carrying. The card support is formed by bonding two plastic boards 1a and 1b together, plastic boards 1a and 1b preferably being made of, for example, polyvinyl chloride in a layered configuration. A substantially rectangular bore 2 is formed in a portion of plastic board 1a and is formed of a lower bore 2a having a substantially rectangular configuration and a second upper bore 2b having a substantially rectangular configuration with an area greater than that of the substantially rectangular configuration formed by lower bore 2a, such that a bore support surface 2c is formed on which a printed circuit board 3 rests with its upper surface being coplanar with the upper exposed surface of plastic board 1a. Printed circuit board 3 is provided with connection terminals $T_1$–$T_7$, indicated generally by T in FIG. 2, extending in the widthwise direction of memory card 1. More particularly, connection terminal $T_1$ constitutes a power source terminal, connection terminals $T_2$–$T_6$ constitute signal terminals and connection terminal $T_7$ constitutes a common ground terminal. Similar lead terminals $T_1'$–$T_7'$, indicated generally by T' in FIG. 2, are formed on the bottom or back surface of printed circuit board 3 at positions corresponding to connection terminals $T_1$–$T_7$, respectively, and bores are formed in printed circuit board 3 through which connection terminals $T_1$–$T_7$ are electrically connected to respective lead terminals $T_1'$–$T_7'$. More particularly, a conductive material 3A is provided to fill each bore, thereby electrically connecting connection terminals $T_1$–$T_7$ with the respective lead terminals $T_1'$–$T_7'$.

A semiconductor integrated circuit (IC) 4, preferably a complementary metal oxide semiconductor (CMOS), is also provided on the back surface of printed circuit board 3 for storing a program and personal data, such as an ID number, ID code and the like. As shown in FIG. 3, IC 4 is preferably formed as a single chip micro-computer with a central processing unit (CPU) 41, a read only memory (ROM) 42 which stores a program for the CPU, personal data and the like, and a random access memory (RAM) 43 which provides a memory work area for the micro-computer. IC 4 is provided with respective terminals which are soldered in a predetermined wiring pattern so as to be connected to respective connection terminals $T_1$–$T_7$ through lead terminals $T_1'$–$T_7'$.

It is to be appreciated that printed circuit board 3 may be bonded to support surface 2c and thereby effectively forms part of the card support. In addition, a filling material 5, preferably an epoxy resin or the like is provided in lower bore 2a, as shown in FIG. 2, for bonding printed circuit board 3 to the card support, and also bonding IC 4 to printed circuit board 3.

As shown in FIG. 1, the upper exposed surface of plastic board 1a has a display portion separate from printed circuit board 3 which has various designations formed thereon by punching out or pressing into the surface of plastic board 1a of memory card 1 and may, for example, include reference numerals 6A or the like. In addition, an arrow 6B may be printed on the upper surface of plastic board 1a to indicate the direction of insertion of memory card 1 into a card reader 50, shown schematically in FIG. 3. At such time, respective contacts provided within card reader 50 contact respective connection terminals $T_1$–$T_7$ of memory card 1 such that a drive voltage and control signals are supplied to IC 4 so as to read out information from IC 4, which is then supplied to card reader 50.

It is to be appreciated that with memory card 1 of FIG. 1, since connection terminals $T_1$–$T_7$ are exposed on the upper surface thereof, a relatively large static electricity generated from a human body or from clothes, particularly clothes made of chemical fibers and the like, may be supplied to connection terminals $T_1$–$T_7$, which static electricity is then discharged to CMOS IC 4, whereby IC 4 may be damaged or destroyed by such static electricity. While CMOS IC 4 can withstand approximately 200 volts, static electricity may sometimes reach several thousand volts. For this reason, and since the input impedance of CMOS IC 4 is large, resistors Ra, Rb, Rc, Rd and Re having relatively large resistance values of, for example, 20KΩ–30KΩ or more, are connected in series between connection signal terminals $T_2$–$T_6$ and IC 4, to thereby prevent IC 4 from being destroyed by static electricity. However, it is to be appreciated that a drive current of about 1 mA flows to IC 4 through power source connection terminal $T_1$ when IC 4 is energized so that a resistor having a relatively high resistance value, as aforementioned, cannot be connected in series between power source connection terminal $T_1$ and IC 4. Accordingly, if no resistor or a resistor having a small resistance value of, for example, approximately 100Ω, is provided, IC 4 may be destroyed by static electricity through power source connection terminal $T_1$. In addition, although resistors Ra, Rb, Rc, Rd and Re are connected in series between IC 4 and signal connection terminals $T_2$–$T_6$ to protect IC 4 against static electricity, if the resistance values of the resistors increase too much, the time constant determined by each resistor and the input capacitance of IC 4 tend to cause the waveforms of the respective signals to be blunted and delayed.

Figure 4:
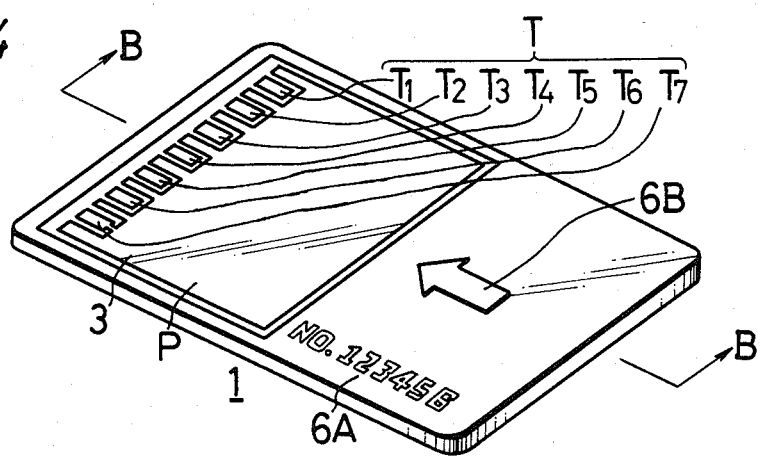
FIG. 4 is a schematic perspective view of a memory card according to one embodiment of the present invention.
Figure 7:
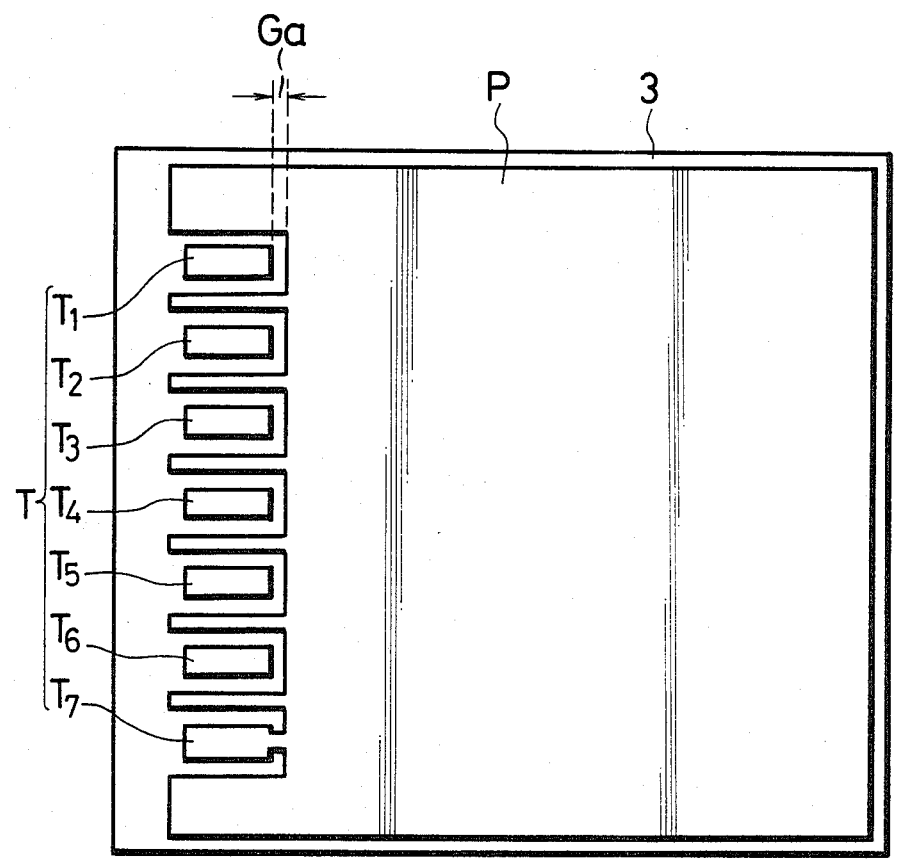
FIG. 7 is a schematic top plan view of a printed circuit board according to one embodiment of the present invention that can be used with the memory card of FIG. 4.
Figure 8:
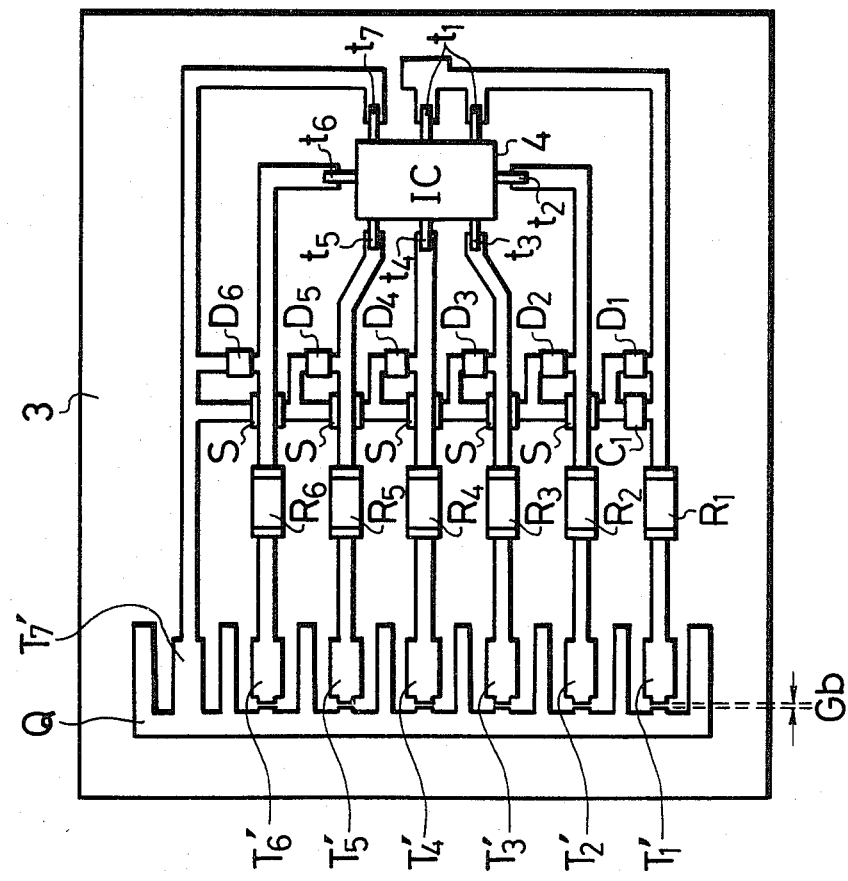
FIG. 8 is a schematic bottom plan view of a printed circuit board according to one embodiment of the present invention that can be used with the memory card of FIG. 4.

Referring now to FIGS. 4–8, a memory card 1 according to a first embodiment of the present invention will now be described in which elements corresponding to those previously discussed in regard to the memory card of FIG. 1 are identified by the same reference numerals, and a detailed description thereof will be omitted herein for the sake of brevity. As shown in FIGS. 4 and 7, common ground connection terminal $T_7$ provided on the exposed upper surface of printed circuit board 3 is extended to cover substantially the entire surface region thereof other than that covered by connection terminals $T_1$–$T_6$ to thereby form a first common ground electrode unitary pattern P which is separated from connection terminals $T_1$–$T_6$ by a predetermined distance therebetween which defines first discharge gaps Ga. As shown in FIG. 8, common ground lead terminal $T_7'$ formed on the back or lower surface of printed circuit board 3 is extended to cover a substantially U-shaped surface region to thereby form a second common ground electrode pattern Q which is separated from the other lead terminals $T_1'$–$T_6'$ by a predetermined distance and thereby defines second discharge gaps Gb. First and second common ground electrode patterns P and Q are electrically connected to each other through common ground connection terminal $T_7$, common ground lead terminal $T_7'$ and the conductive material 3A which connects these latter terminals.

The spacing or length of discharge gaps Gb formed on the back surface of printed circuit board 3 is selected to be relatively narrow, for example, less than or equal to 100 μm so as to easily provide for discharge thereacross. In addition, the spacing or length of discharge gaps Ga formed on the front or upper surface of printed circuit board 3 is preferably selected to be narrow, although wider than discharge gaps Gb. The reason for the wider dimension of discharge gaps Ga is to prevent deterioration of the insulation formed between first common ground electrode pattern P and terminals $T_1$–$T_6$ caused by dust, moisture and the like.

Figure 5:
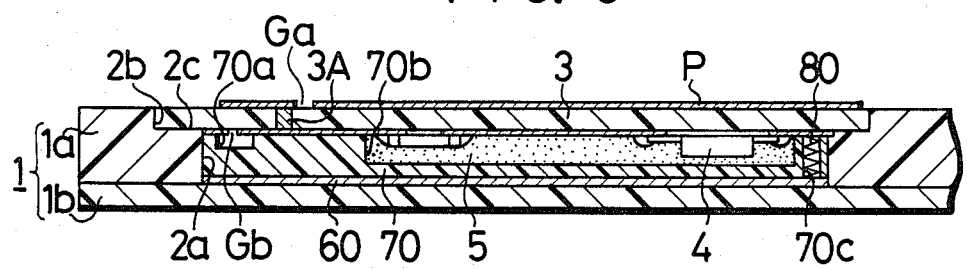
FIG. 5 is an enlarged cross-sectional view of the memory card of FIG. 4 taken along line B—B thereof.
Figure 6:
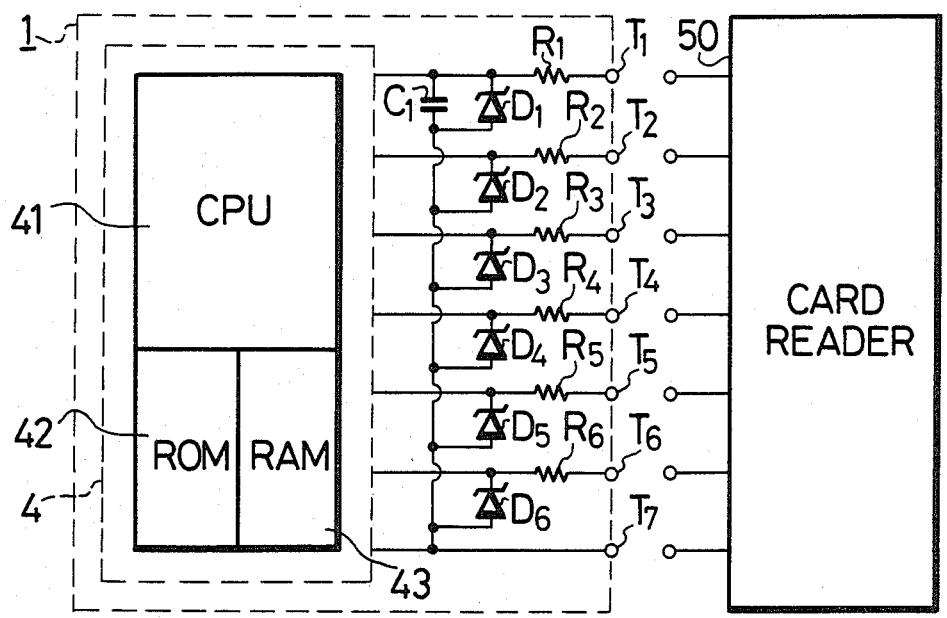
FIG. 6 is a schematic block diagram used for explaining the operation of the memory card of FIG. 4 with a card reader.

As shown in FIG. 5, plastic board 1a having bore 2 is bonded to plastic board 1b, as with the memory card of FIG. 1. A conductive plate 60, preferably a metal-plated thin stainless steel plate, is inserted at the lower end of lower bore 2a of bore 2. A frame member 70 of synthetic resin is positioned in lower bore 2a above conductive plate 60 and is engaged therewith. Frame member 70 is formed with two recess portions 70a and 70b at the upper end thereof and a bore 70c. The aforementioned epoxy resin filling material 5 is provided to fill recess portion 70b so as to bond printed circuit board 3 in upper bore 2b and to bond IC 4 and other circuit elements to be described later, such as resistors $R_1$–$R_6$, Zener diodes $D_1$–$D_6$ and a capacitor $C_1$, to printed circuit board 3, upon hardening of filler 5, in a manner similar to that previously described with respect to the memory card of FIG. 1. On the other hand, recess portion 70a is not filled with any such material and thereby remains empty, and is positioned in opposing relation to discharge gaps Gb. A coil spring 80 of a conductive metal is inserted into bore 70c to thereby electrically connect conductive plate 60 to common ground lead terminal $T_7'$ of second common ground electrode pattern Q provided on the back or lower surface of printed circuit board 3.

As shown in FIG. 8, resistors $R_1$–$R_6$ are connected in series between lead terminals $T_1'$–$T_6'$ and corresponding access terminals $t_1$–$t_6$, respectively, of IC 4 on the back surface of printed circuit board 3. In addition, connection terminal $T_7$ is connected through lead terminal $T_7'$ to the common ground terminal $t_7$ of IC 4. Lead terminal $T_7'$ is also connected through Zener diodes $D_1$–$D_6$ to terminals $t_1$–$t_6$, respectively, of IC 4, and a capacitor $C_1$ is connected between terminal $t_1$ of IC 4 and lead terminal $T_7'$, in parallel with Zener diode $D_1$. It is to be appreciated that insulation layers S are provided to electrically isolate the respective terminal patterns. In a preferred embodiment, resistor $R_1$ is selected to have a resistance value of, for example, 100Ω to prevent a large voltage drop from occurring thereacross when a drive current flows to IC 4, while each of resistors $R_2$–$R_6$ is selected to have a larger resistance value, for example, approximately 5–10KΩ. Moreover, diodes $D_1$–$D_6$ have a Zener voltage which is larger than the drive voltage applied to the IC 4 or the signal voltage derived therefrom, but is smaller than the withstanding voltage of IC 4, that is, the voltage at which the IC 4 will be damaged. For example, if the drive voltage of IC 4 is 4.5 V, the Zener voltage can be selected as 6.8 V. Furthermore, capacitor $C_1$ is selected to have a capacitance of, for example, 0.01 μF, so as to provide for an excellent high frequency characteristic and so as to smooth the rising edge of the voltage supplied to IC 4.

According to the memory card of FIGS. 4–8, during normal operation when the drive voltage or signal voltage which is at most equal to several volts, is supplied to connection terminals $T_1$–$T_6$, no discharge of such voltage is generated across discharge gaps $G_a$ and $G_b$. In such case, although the drive current to IC 4 flows through resistor $R_1$, the voltage drop across resistor $R_1$ is small and the Zener voltage of diode $D_1$ is larger than the drive voltage of IC 4 so that the normal drive voltage is applied to IC 4. Thus, since the input impedance of IC 4 is sufficiently large compared with the resistance value of resistors $R_2$–$R_6$, and since the impedance of the card reader circuitry which reads information from memory card 1 can also be selected sufficiently large, the information can normally be obtained from IC 4.

On the other hand, when a finger or the like which produces a large static electricity contacts terminals $T_1$–$T_6$, the probability is large that such finger will also contact first common ground electrode pattern P which surrounds connection terminals $T_1$–$T_6$, at the same time, so as to discharge the static electricity through electrode pattern P to prevent such static electricity from being applied to connection terminals $T_1$–$T_6$.

Even if such static electricity is applied only to connection terminals $T_1$–$T_6$, in accordance with the present invention, such static electricity is discharged to common ground electrode patterns P and Q through discharge gaps Ga and Gb, respectively. It is to be appreciated that, since discharge gaps Gb are formed within memory card 1 rather than on the surface thereof as with discharge gaps Ga, the insulation area between lead terminals $T_1'$–$T_7'$ and common ground electrode pattern Q is not degraded by dust, moisture and the like as with discharge gaps Ga so that spacing of the discharge gaps Gb can be reduced in comparison with discharge gaps Ga. In this regard, most of the static electricity is discharged across gaps Gb, thereby protecting IC 4 from being destroyed or damaged by static electricity.

Further, even if a small amount of static electricity is not discharged through discharge gaps Gb, such remaining static electricity is suppressed by resistors $R_1$–$R_6$ and diodes $D_1$–$D_6$ so that only static electricity of a voltage equal to the Zener voltage of diodes $D_1$–$D_6$ is applied to IC 4, such voltage being insufficient to damage or destroy IC4. Since most of the static electricity is thereby discharged through discharge gaps Ga and Gb with only a small amount of remaining static electricity being discharged through resistors $R_2$–$R_6$ and diodes $D_2$–$D_6$, the values of these latter elements can be made relatively small and can be made of a smaller size. Since the resistance values of resistors $R_2$–$R_6$ are not required to be so large, the waveforms of the respective signals are not blunted and are not delayed.

It is to be noted that there is generally a period of delay until a voltage supplied to a Zener diode is actually limited thereby. During this delay period, the voltage which is not yet limited would normally be supplied to IC 4. However, in accordance with the present invention, during such delay period, the static electricity is absorbed or stored by capacitor $C_1$ (and resistor $R_1$) so that static electricity of a voltage higher than the withstanding voltage of IC 4 is not applied to terminal $t_1$ thereof. Although no capacitor is connected to terminals $t_2$–$t_6$ of IC 4, resistors $R_2$–$R_6$ have sufficiently large resistance values by which static electricity during the delay period of diodes $D_2$–$D_6$ can be attenuated. Thus, during the aforementioned delay period, IC 4 is protected from static electricity. For example, according to experiment, even when a capacitor with a capacitance of 200 pF was charged with a voltage of 10K V and the charged capacitor was connected to terminals $t_1$–$t_6$ to simulate the application of static electricity, IC 4 was sufficiently protected from such static electricity.

It is to be appreciated that conductive plate 60, common ground electrode pattern P and common ground connection terminal $T_7$ are all electrically connected to each other. Thus, even if memory card 1 cracks so that plastic boards 1a and 1b become detached slightly from each other, there is no risk that discharge current from static electricity can jump into IC 4. The same is true of external noise and the like.

Figure 9:
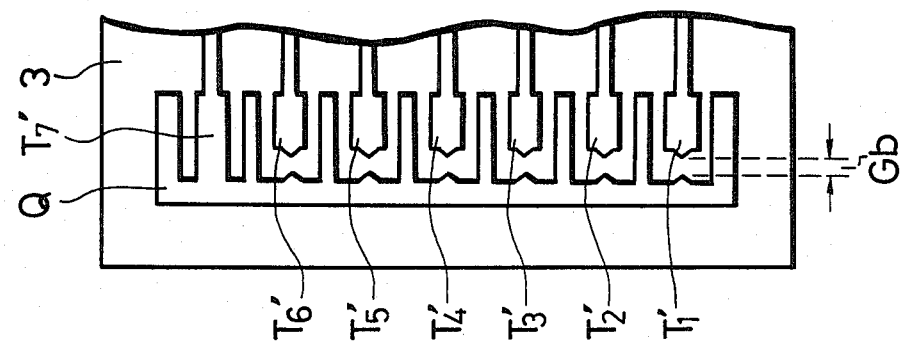
FIG. 9 is a schematic bottom plan view of a portion of the printed circuit board according to another embodiment of the present invention that can be used with the memory card of FIG. 4.

In accordance with the present invention, the spacing between first and second discharge gaps Ga and Gb need not satisfy the condition Ga>Gb. More particularly, in accordance with another embodiment of the present invention, first and second discharge gaps Ga and Gb are selected to be equal. In this latter embodiment, the connections on the front and back surfaces of printed circuit board 3 are identical to those previously described in regard to FIGS. 7 and 8. However, second discharge gaps Gb are defined by triangularly pointed portions of lead terminals $T_1'-T_6'$ in opposing relation to corresponding triangularly pointed portions of common ground electrode pattern Q, as shown in FIG. 9, so that discharge more readily occurs across second discharge gaps Gb than first discharge gaps Ga.

It is to be appreciated that various modifications may be made by one of ordinary skill in the art within the scope of the present invention. For example, resistors $R_1-R_6$ may be connected between diodes $D_1-D_6$ and terminals $t_1-t_6$, respectively.

Having described specific preferred embodiments of the present invention with reference to the accompanying drawings, it is to be understood that the present invention is not limited to those precise embodiments, and that various changes and modifications may be effected therein by one of ordinary skill in the art without departing from the scope and spirit of the invention as defined by the appended claims.

What is claimed is:

1. A memory card for use as a credit card and/or identification card and comprising:
   card support means;
   integrated circuit means mounted on said card support means for storing information and including a plurality of access terminals;
   a plurality of connection terminals provided on an exposed surface of said card support means and respectively connected to said access terminals on said integrated circuit means; and
   unitary discharge pattern means provided on said exposed surface of said card support means and separated from each of said connection terminals by a discharge gap for discharging static electricity from said connection terminals to said discharge pattern means to prevent damage to said integrated circuit means.

2. A memory card comprising:
   card support means;
   integrated circuit means mounted on said card support means for storing information and including access terminal means;
   connection terminal means provided on an exposed surface of said card support means and connected to said access terminal means on said integrated circuit means;
   discharge means for discharging static electricity from said connection terminal means to prevent damage to said integrated circuit means;
   said discharge means including discharge pattern means provided on said exposed surface of said card support means and separated from said connection terminal means by at least one first discharge gap; and
   lead terminal means provided on a second non-exposed surface of said card support means and connected between said connection terminal means and said integrated circuit means; and in which said discharge means further includes second discharge pattern means provided on said second non-exposed surface of said card support means and separated from said lead terminal means by at least one second discharge gap to discharge static electricity from said lead terminal means and thereby discharge static electricity from said connection terminal means.

3. A memory card according to claim 2; in which said lead terminal means includes a plurality of lead terminals provided on said second non-exposed surface of said card support means, and said second discharge pattern means includes a second common ground electrode pattern provided on said second non-exposed surface of said card support means surrounding said plurality of lead terminal means and separated therefrom by said at least one second discharge gap.

4. A memory card according to claim 3; in which said at least one second discharge gap more easily provides discharge of said static electricity than said at least one first discharge gap.

5. A memory card comprising:
   card support means;
   integrated circuit means mounted on said card support means for storing information and including access terminal means;
   connection terminal means provided on an exposed surface of said card support means and connected to said access terminal means on said integrated circuit means;
   discharge means for discharging static electricity from said connection terminal means to prevent damage to said integrated circuit means; and
   lead terminal means connected between said connection terminal means and said integrated circuit means, and in which said discharge means includes a first common ground discharge pattern for discharging static electricity from said connection terminal means and a second common ground discharge pattern for discharging static electricity from said connection terminal means through said lead terminal means.

6. A memory card according to claim 5; in which said second discharge pattern more easily provides discharge of said static electricity than said first discharge pattern.

7. A memory card according to claim 5; in which said first discharge pattern is separated from said connection terminal means by at least one first discharge gap and said second discharge pattern is separated from said lead terminal means by at least one second discharge gap.

8. A memory card according to claim 7; in which said at least one first discharge gap is greater than said at least one second discharge gap.

9. A memory card according to claim 7; in which said at least one second discharge gap is equal to said at least one first discharge gap, and said at least one second discharge gap is defined by pointed portions of said second discharge pattern in opposing relation to pointed portions of said lead terminal means so as to more easily cause a discharge of said static electricity than said at least one first discharge gap.

10. A memory card according to claim 5; in which said lead terminal means includes a power source terminal and at least one signal terminal, and further comprising resistor means connected between said power source terminal and at least one signal terminal and said integrated circuit means.

11. A memory card according to claim 10; in which said resistor means each have a resistance value in the range between 5KΩ and 10KΩ.

12. A memory card according to claim 5; in which said lead terminal means includes a power source terminal, at least one signal terminal and a common ground terminal; and further comprising Zener diode means connected between said power source terminal and at least one signal terminal and said common ground terminal, and capacitor means connected between said power source terminal and said common ground terminal.

13. A memory card according to claim 1; in which said integrated circuit means includes central processing means, random access memory means and read only memory means.

* * * * *